United States Patent
Dong et al.

(10) Patent No.: US 8,766,622 B2
(45) Date of Patent: Jul. 1, 2014

(54) VOLTAGE MEASURING APPARATUS FOR BUCK CIRCUIT

(75) Inventors: Jia-Qi Dong, Shenzhen (CN); Bo Deng, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 304 days.

(21) Appl. No.: 13/337,131

(22) Filed: Dec. 25, 2011

(65) Prior Publication Data

US 2013/0082686 A1    Apr. 4, 2013

(30) Foreign Application Priority Data

Sep. 30, 2011   (CN) .......................... 2011 1 0296816

(51) Int. Cl.
  *G01R 19/22* (2006.01)
  *G01R 19/25* (2006.01)
  *H02M 3/158* (2006.01)

(52) U.S. Cl.
  CPC ............. *G01R 19/25* (2013.01); *H02M 3/1582* (2013.01)
  USPC .......................................... 324/119; 324/76.11

(58) Field of Classification Search
  CPC ............. H03J 2200/10; H03J 2200/08; H04B 17/0027; G03G 15/80; H02M 3/1582; G01R 27/26; G01R 19/25
  See application file for complete search history.

(56) References Cited

U.S. PATENT DOCUMENTS 4,578,630 A * 3/1986 Grosch .......................... 323/271

* cited by examiner

*Primary Examiner* — Minh N Tang
(74) *Attorney, Agent, or Firm* — Novak Druce Connolly Bove + Quigg LLP

(57) ABSTRACT

A voltage measuring apparatus electrically connected to buck circuits includes the same number of RC circuits as there are buck circuits, an analog/digital (A/D) convertor, a controller, and a display unit. Each RC circuit is configured to be electrically connected in parallel with an inductor of one corresponding buck circuit. The A/D convertor selectively obtains an analog voltage of one of the buck circuits, and converts the analog voltage signal into a digital voltage signal. The controller controls the A/D convertor and receives the digital voltage signal from the A/D convertor. The display unit displays a decimal voltage value based on the digital voltage signal.

8 Claims, 3 Drawing Sheets

VOLTAGE MEASURING APPARATUS FOR BUCK CIRCUIT

BACKGROUND

1. Technical Field

The disclosure generally relates to voltage measuring apparatuses, and particularly to a voltage measuring apparatus used to measure a voltage across an inductor of a buck circuit.

2. Description of Related Art

In FIG. 2, a buck circuit 200 includes a pulse width modulation unit (PWM) 210, an inductor L, a capacitor C1, and an output terminal VOUT. The inductor L is connected between the PWM 210 and the output terminal VOUT. An end of the capacitor C1 is electrically connected between the inductor L and the output terminal VOUT. Another end of the capacitor C1 is grounded.

During design and manufacture of the buck circuit 200, a voltage across the inductor L needs to be measured. In FIG. 3, to measure the voltage across the inductor L according to the method of related art, an RC circuit is electrically connected to the inductor L in parallel. The RC circuit includes a resistor R1 and a capacitor C2 electrically connected in series. A voltmeter 300 is electrically connected to the two ends of the capacitor C2 to measure the voltage across the capacitor C2 which is substantially equal to that of the inductor L.

However, the voltmeter 300 is susceptible to interference from peripheral circuits, and may be difficult to obtain a precise value. Moreover, to measure voltages across inductors of multiple buck circuits, a corresponding number of voltmeters 300 are needed, which is inconvenient.

Therefore, there is room for improvement within the art.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the disclosure.

DETAILED DESCRIPTION

Figure 1:
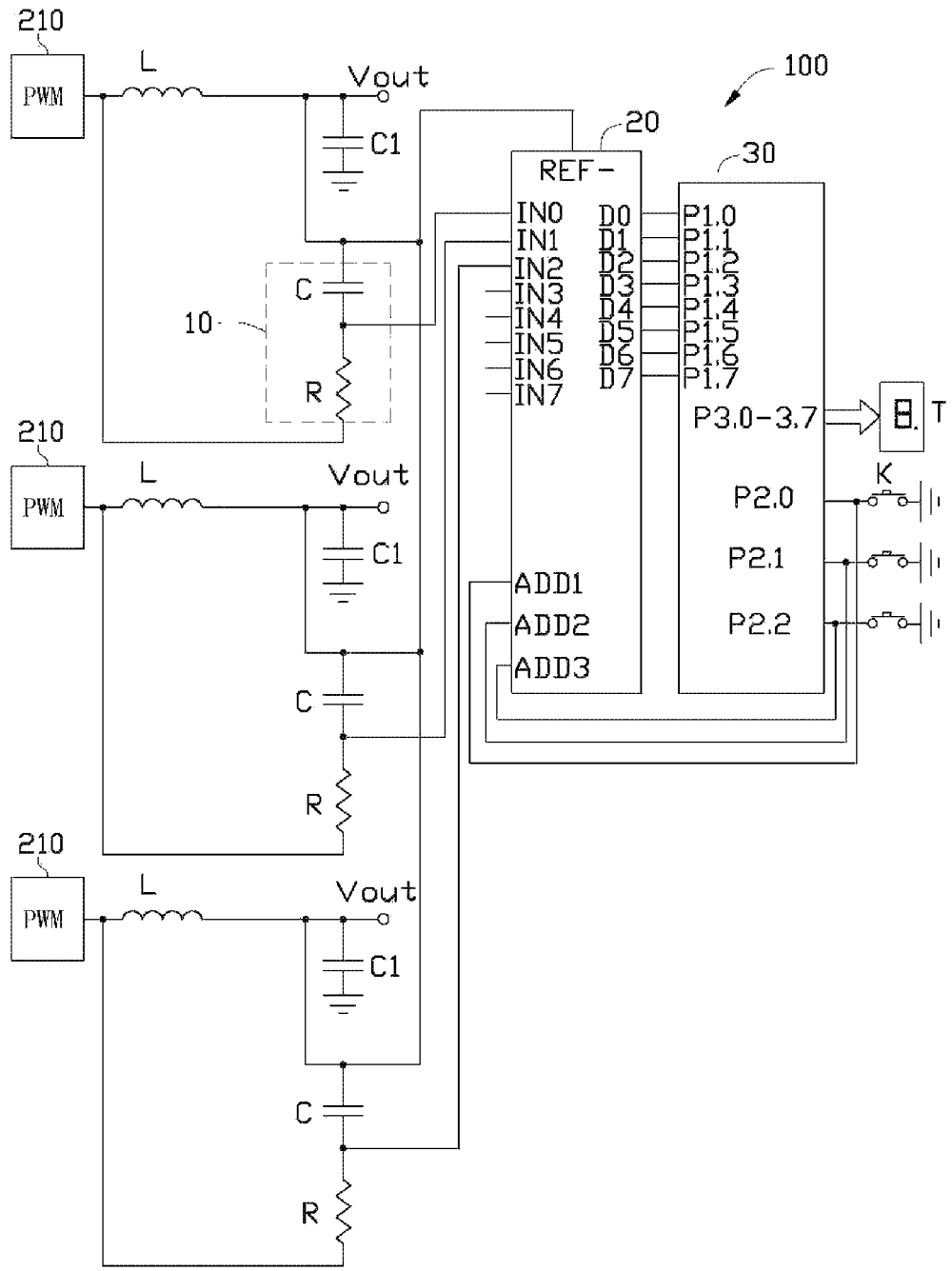
FIG. 1 is a schematic circuit diagram of a voltage measuring apparatus used to measure voltages across inductors of multiple buck circuits, according to an exemplary embodiment of the disclosure.
Figure 2:
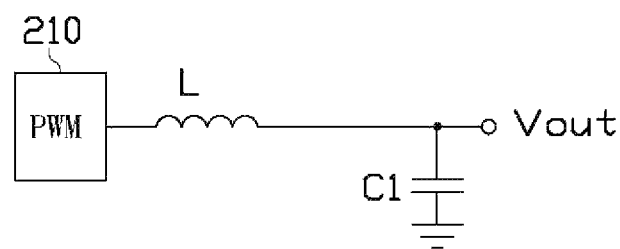
FIG. 2 is a circuit diagram of a buck circuit.
Figure 3:
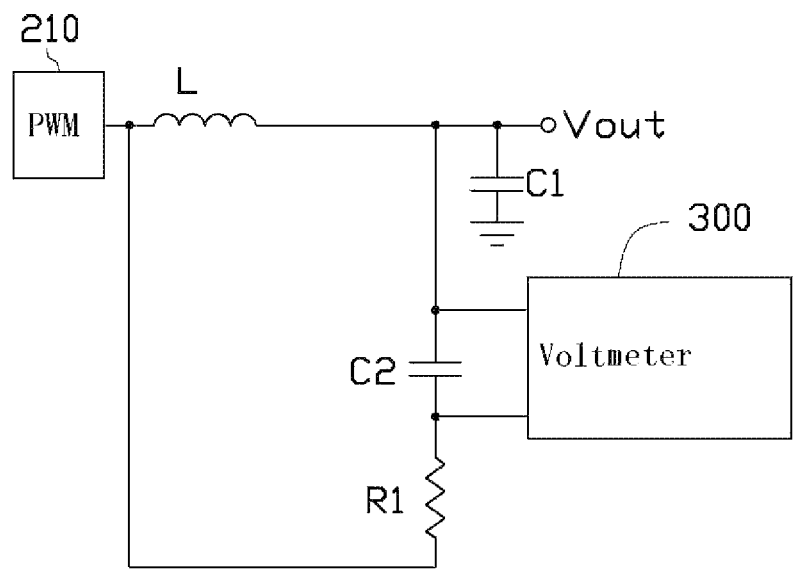
FIG. 3 is a circuit diagram of the buck circuit of FIG. 2 and a voltmeter used to measure a voltage across an inductor of the buck circuit.

FIG. 1 is a circuit diagram of a voltage measuring apparatus 100 used to measure voltages across inductors L of multiple buck circuits 210, according to an exemplary embodiment of the disclosure. In this embodiment, the voltage measuring apparatus 100 is electrically connected to the buck circuits 210 (three taken as an example), and is used to measure voltages across all of the three inductors L of the buck circuits 210. It should be understood that three buck circuits are taken as an example for simplicity and the number of buck circuits may vary depending on the embodiment without varying from the spirit of the disclosure.

The voltage measuring apparatus 100 includes a plurality of RC circuits 10, an analog/digital (A/D) convertor 20, a controller 30, a plurality of switches K, and a display unit T.

The number of the RC circuits 10 corresponds to the number of the buck circuits 210. In this embodiment, each of the three RC circuits 10 is respectively electrically connected to one of the inductors L in parallel. Each RC circuit 10 includes a resistor R and a capacitor C electrically connected in series.

The A/D convertor 20 is an eight bit A/D converting microchip. The A/D convertor 20 includes eight analog input contacts IN0-IN7, a reference voltage contact REF-, three address contacts ADD1-ADD3 and eight digital output contacts D0-D7 corresponding to the eight analog input contacts IN0-IN7. In this embodiment, each of the three analog input contacts IN0-IN2 are connected to a node between the capacitor C and the resistor R of each RC circuit 210, and the other analog input contacts IN3-IN7 are idle. The analog input contacts IN0-IN2 are configured for obtaining analog voltages across the three inductors L. The output contacts D0-D7 are electrically connected to the controller 30 and send digital voltages representing the analog voltages to the controller 30.

The three address contacts ADD1, ADD2, and ADD3 are configured for triggering one of the input contacts IN0-IN2 to obtain the voltage across an inductor L. For example, when the address contacts ADD1, ADD2, and ADD3 are all set to be at a low level voltage (i.e. logic 0), the input contact IN0 is triggered and selected. An exemplary embodiment of the relationships between the digital states of the address contacts ADD1, ADD2, and ADD3 and the triggered input contact is shown as the following table:

| Address contact ADD1 | Address contact ADD2 | Address contact ADD3 | Triggered input contact |
|---|---|---|---|
| 0 | 0 | 0 | IN0 |
| 0 | 0 | 1 | IN1 |
| 0 | 1 | 0 | IN2 |
| 0 | 1 | 1 | IN3 |
| 1 | 0 | 0 | IN4 |
| 1 | 0 | 1 | IN5 |
| 1 | 1 | 0 | IN6 |
| 1 | 1 | 1 | IN7 |

The controller 30 is a single chip microcomputer which includes a plurality of control contacts P2.0, P2.1, and P2.2, a plurality of data input contacts P1.0-P1.7, and a plurality of data output contacts P3.0-P3.7.

The control contacts P2.0, P2.1, P2.2 are all grounded via one of the switches K, and each one of the control contacts P2.0, P2.1, P2.2 are connected to one of the address contacts ADD1, ADD2, ADD3. When one of the switches K is turned on, the control contact and the connected address contact are grounded (i.e. set to be logic 0). Each of the data input contacts P1.0-P1.7 is connected one of the output contacts D0-D7 to receive a digital voltage signal. The data output contacts P3.0-P3.7 are electrically connected to the display unit T, in this embodiment, the display unit T is a digital tube. The controller 30 converts the digital voltage signal to a decimal number (i.e. a voltage value) and sends the decimal number to the display unit T. The display unit T displays the voltage value.

To measure the voltage of one inductor L of the buck circuits 200, for example, the inductor L of a front buck circuit 210; one of the RC circuits 10 corresponding to the input contact IN0 is electrically connected to the two ends of the inductor L. The switches K are all turned on. Thus, the input contact IN0 is triggered and obtains an analog voltage signal of the front buck circuit 210. The A/D convertor 20 converts the analog voltage signal to a digital voltage signal and sends the digital voltage signal to the data input contact P1.0. The controller 30 converts the digital voltage signal to a decimal number (i.e. a voltage value). Each of the inductors L of the other buck circuits 210 also can be measured in a similar way by controlling the on/off states of the switches K.

The voltage measuring apparatus 100 can measure voltages across inductors L of multiple buck circuits 210 with greater convenience. In addition, no voltmeter is needed during the measuring process, thus the magnitude of interference attributable to the peripheral circuits is reduced.

It is believed that the exemplary embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A voltage measuring apparatus electrically connected to buck circuits, comprising:
    a plurality of RC circuit corresponding to the buck circuits, each RC circuit configured to be electrically connected in parallel with an inductor of one corresponding buck circuit;
    an analog/digital (A/D) convertor selectively obtaining an analog voltage of one of the buck circuits, and converting the analog voltage signal into a digital voltage signal;
    a controller controlling the A/D convertor, and receiving the digital voltage signal from the A/D convertor; and
    a display unit displaying a decimal voltage value based on the digital voltage signal.

2. The voltage measuring apparatus of claim 1, wherein each RC circuit comprises a resistor and a capacitor electrically connected in series; the A/D convertor comprises a plurality of analog input contacts and a reference voltage contact; the analog input contacts are respectively electrically connected to a node between the resistor and the capacitor of each buck circuit, the reference voltage contact is electrically connected to nodes between the inductor of each buck circuit and each corresponding capacitor.

3. The voltage measuring apparatus of claim 2, wherein the controller comprises a plurality of control contacts, the control contacts are respectively grounded by a switch, the A/D converter further comprises a plurality of address contacts respectively connected to the control contacts, the input contact is triggered by controlling on/off states of the switches.

4. The voltage measuring apparatus of claim 3, wherein the A/D converter comprises a plurality of digital output contacts, the controller comprises a plurality of data input contact corresponding to the output contacts, and respectively being connected to the corresponding digital output contact.

5. The voltage measuring apparatus of claim 3, wherein the controller comprises a plurality of data output contacts electrically connected to the display.

6. The voltage measuring apparatus of claim 1, wherein the controller converts the digital voltage signal to decimal data, and sends the decimal data to the display unit.

7. The voltage measuring apparatus of claim 1, wherein the controller is a single chip microcomputer.

8. The voltage measuring apparatus of claim 1, wherein the A/D convertor is an eight bit A/D converting microchip.

* * * * *